United States Patent
Wayner

[19]

[11] Patent Number: 6,031,393
[45] Date of Patent: Feb. 29, 2000

[54] PASS GATE INPUT BUFFER FOR A MIXED VOLTAGE ENVIRONMENT

[75] Inventor: Zelig Wayner, Haifa, Israel

[73] Assignee: Intel Corporation, Santa Clara, Calif.

[21] Appl. No.: 09/001,506

[22] Filed: Dec. 31, 1997

[51] Int. Cl.[7] .................. H03K 19/0175; H03K 19/094
[52] U.S. Cl. ................... 326/81; 326/68; 326/83
[58] Field of Search ................... 326/80, 81, 83, 326/86, 113, 121, 68

[56] References Cited

U.S. PATENT DOCUMENTS

| | | | |
|---|---|---|---|
| 4,574,273 | 3/1986 | Atsumi et al. | 326/81 |
| 5,223,751 | 6/1993 | Simmons et al. | 326/81 |
| 5,541,546 | 7/1996 | Okumura | 327/333 |
| 5,576,635 | 11/1996 | Partovi et al. | 326/27 |

*Primary Examiner*—Michael Tokar
*Assistant Examiner*—Daniel Chang

*Attorney, Agent, or Firm*—Blakely, Sokoloff, Taylor & Zafman LLP

[57] ABSTRACT

An input buffer to interface among devices on a main circuit board is described. The input buffer includes a first transistor coupled between a first terminal and an input terminal of an inverter. The first transistor has an enable terminal adapted to be coupled to a first voltage supply. A second transistor that is coupled between the first terminal and the input terminal is also included. The input buffer further includes a control circuit to enable the second transistor. The control circuit is coupled to the first terminal, an enable terminal of the second transistor, the input terminal, and an output terminal of the inverter. A method for buffering signals among devices on a main circuit board comprises receiving a first signal in a first state from a first device. A first portion of the first signal is transmitted through a first transistor. A second portion of the first signal is transmitted through a second transistor. A second signal is generated by applying the first signal to the enable terminals of the third and fourth transistors. The second signal is then transmitted to a second device.

28 Claims, 4 Drawing Sheets

PASS GATE INPUT BUFFER FOR A MIXED VOLTAGE ENVIRONMENT

BACKGROUND OF THE INVENTION

1. Field of the Invention

The invention relates in general to the field of logic circuits, and, more particularly, to logic circuits used in computer systems. Specifically, the invention relates to an input buffer to interface between a central processing unit and other components on a main logic circuit board within a mixed voltage environment.

2. Description of the Related Art

With the growing complexity of modern computer systems and the availability of various types of peripheral devices on the main circuit board, designers are constantly seeking more efficient methods to improve the circuits that serve as interfaces between these peripheral devices and the central processing unit.

Typically, a voltage $V_{cc}$ is associated with a processor voltage supply, while a voltage $V_{ccp}$ is associated with a peripheral voltage supply. The peripheral voltage Vccp is often larger than the processor supply voltage. The voltage differences between these two voltage levels often warrant an interface circuit within the processor to be positioned between the core of the processor and other external components.

Designers today often utilize advanced processors in which the processor supply voltage level has been lowered quickly because of technological advances while the peripheral supply voltage level has been is reduced more slowly. This behavior may cause the voltage difference between the peripheral supply voltage and the processor supply voltage to further increase. Transistors generally have a maximum voltage difference $V_{MAXd}$ that can be applied between the enable terminal and either one of the other terminals. When this voltage difference is exceeded, the transistor may become damaged or fail to operate properly. Gate stress generally results when a voltage difference beyond the maximum voltage difference $V_{MAXd}$ is applied to the enable terminal of a transistor. One skilled in the art will appreciate that the voltage difference $V_{Maxd}$ is typically a little more than the voltage $V_{cc}$, though lower than the voltage $V_{ccp}$. This characteristic of the voltage difference hinders the input signals from being applied directly to internal transistors within the central processing unit.

To reduce the likelihood of damaging a microprocessor (i.e., central processing unit), signals that are generated by a peripheral device and are to be sent to the microprocessor are generally first sent to an input buffer before being sent to other locations within the processor. The input buffer generally receives the input signal and generates a corresponding signal with a voltage level within an allowed range. The input buffer may also be designed to improve the quality of the input signal by removing some of the distortion such that the signals may be used more effectively.

FIG. 1 is a circuit diagram for a conventional input buffer 100 in which an input signal from a peripheral device is applied to a line 105. The input buffer 100 generates an output signal corresponding to the input signal, which is applied to a line 110 and sent to other logic devices inside the processor. A transistor 120 has a gate (enable) terminal 122 coupled to a reference voltage supply, which generates a logically high voltage equal to the voltage $V_{cc}$. When a logically high voltage is applied to the gate terminal 122, the transistor 120 conducts, allowing the input signal applied to the line 105 to be applied to a line 124.

If a high signal is applied to the line 105, the transistor 120 reduces the voltage of the signal passed to the line 124 to approximately the voltage $V_{cc}-V_{tn}$. As previously mentioned, the reference voltage from a peripheral power supply is generally considerably higher than the reference voltage from processor power supply. The voltage level of the logically high input signal is referenced to the voltage $V_{ccp}$ and may vary slightly above or below that voltage. By sending the input signal through the transistor 120, the voltage level of the signal is reduced considerably to the voltage $V_{cc}-V_{tn}$.

By reducing the voltage level of the signal on the line 124, the transistors 130, 135 are not subjected to gate stress. In addition, the transistor 120 is protected from gate stress because the gate terminal is connected to voltage $V_{cc}$ constantly. One skilled in the art will appreciate, if the transistor 120 was removed, the transistors 130, 135 may suffer from gate stress. In addition, the transistors 130, 135; 140, 145 are configured to function as an inverter. Thus, the logic state of the signal on the line 110 would be same as the logic state of the signal on the line 105. A transistor 150 may be used to pull the line 124 to the voltage $V_{cc}$ instead of remaining at the voltage $V_{cc}-V_{tn}$.

One skilled in the art will appreciate that the input buffer 100 simply passes any logically low signals applied to the line 105 without affecting their voltage levels. The input buffer 100 functions to reduce the peripheral voltage level on the line 124 such a manner as to reduce the probability of causing gate stress on the transistors 130, 135 in the first inverting stage. When the core reference voltage $V_{cc}$ is lowered, the voltage level of the signal applied to the line 124 is reduced. One skilled in the art will appreciate that this voltage reduction may be desired in advanced processors. The voltage level generally needed to activate (i.e., trip) the inverting stages, consisting of the transistors 130–145, is approximately equal to the voltage ½ $V_{cc}$.

By reducing the voltage level on the line 124, the inverting stages may malfunction because the voltage on the line may be sufficiently close to the trip voltage. Although the input signal reaches the voltage $V_{ccp}$, the NMOS pass gate 120 passes only the voltage $V_{cc}-V_{tn}$. This voltage may not be sufficient to switch the first inverting stage of the input buffer, since the voltage $V_{cc}-V_{tn}$ is often not larger than the trip voltage of the first inverting stage, which includes the transistors 130, 135, when the voltage $V_{cc}$ is reduced. Alternatively, the first inverting stage may switch at a considerably slower rate. Thus, the conventional input buffer 100 is sensitive to the value of the core reference voltage $V_{cc}$. It would be beneficial to have an input buffer that is capable of overcoming the shortcomings of conventional input buffers.

SUMMARY OF THE INVENTION

The invention relates to an input buffer to interface among devices on a main circuit board. The input buffer includes a first transistor coupled between a first terminal and an input terminal of an inverter. The first transistor has an enable terminal adapted to be coupled to a first voltage supply. A second transistor that is coupled between the terminal and the input terminal is also included. The input buffer further includes a control circuit to enable the second transistor. The control circuit is coupled to the first terminal, an enable terminal of the second transistor, the input terminal, and an output terminal of the inverter.

A method for buffering signals among devices on a main circuit board comprises receiving a first signal in a first state from a peripheral component. A first portion of the first signal is transmitted through a first transistor. A second portion of the first signal is transmitted through a second transistor. A second signal is generated by applying the first signal to enable the terminals of the third and fourth transistors. The second signal is then transmitted to an internal component.

BRIEF DESCRIPTION OF THE DRAWINGS

Other objects and advantages of the invention will become apparent upon reading the following detailed description and upon reference to the drawings in which.

Figure 1:
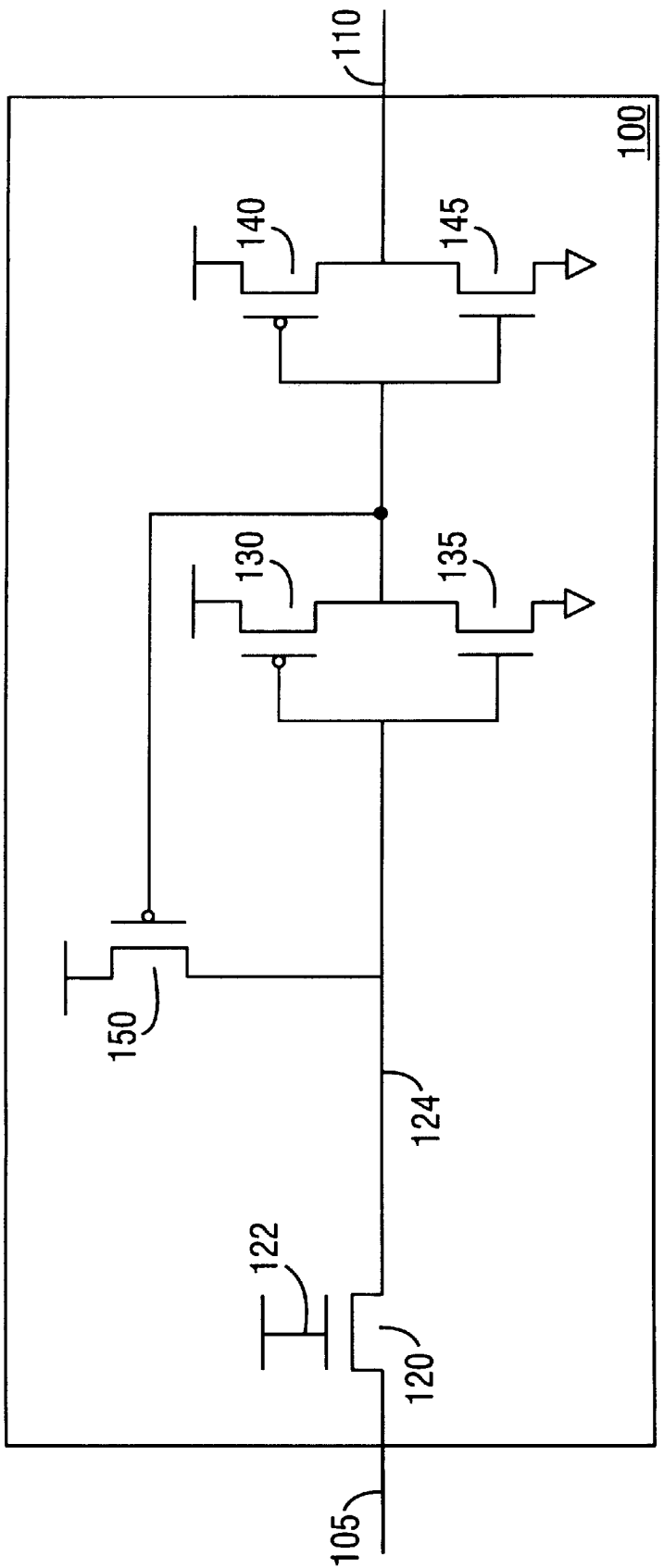
FIG. 1 is a circuit diagram for a conventional input buffer.

While the invention is susceptible to various modifications and alternative forms, specific embodiments have been shown by way of example in the drawings and are described in detail. It should be understood, however, that the description herein of specific embodiments is not intended to limit the invention to the particular forms disclosed. On the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below as they might be employed in a pass gate input buffer in a mixed voltage environment. In the interest of conciseness, not all features of an actual implementation are described in this specification. It will of course be appreciated that in the development of any actual embodiment, numerous implementation-specific decisions must be made to achieve the developer's specific goals, such as compliance with system-related and business-related constraints. Moreover, it will be appreciated that even if such a development effort might be complex and time-consuming, it would nevertheless be a routine undertaking for one of ordinary skill having the benefit of this disclosure.

Overview

Figure 2:
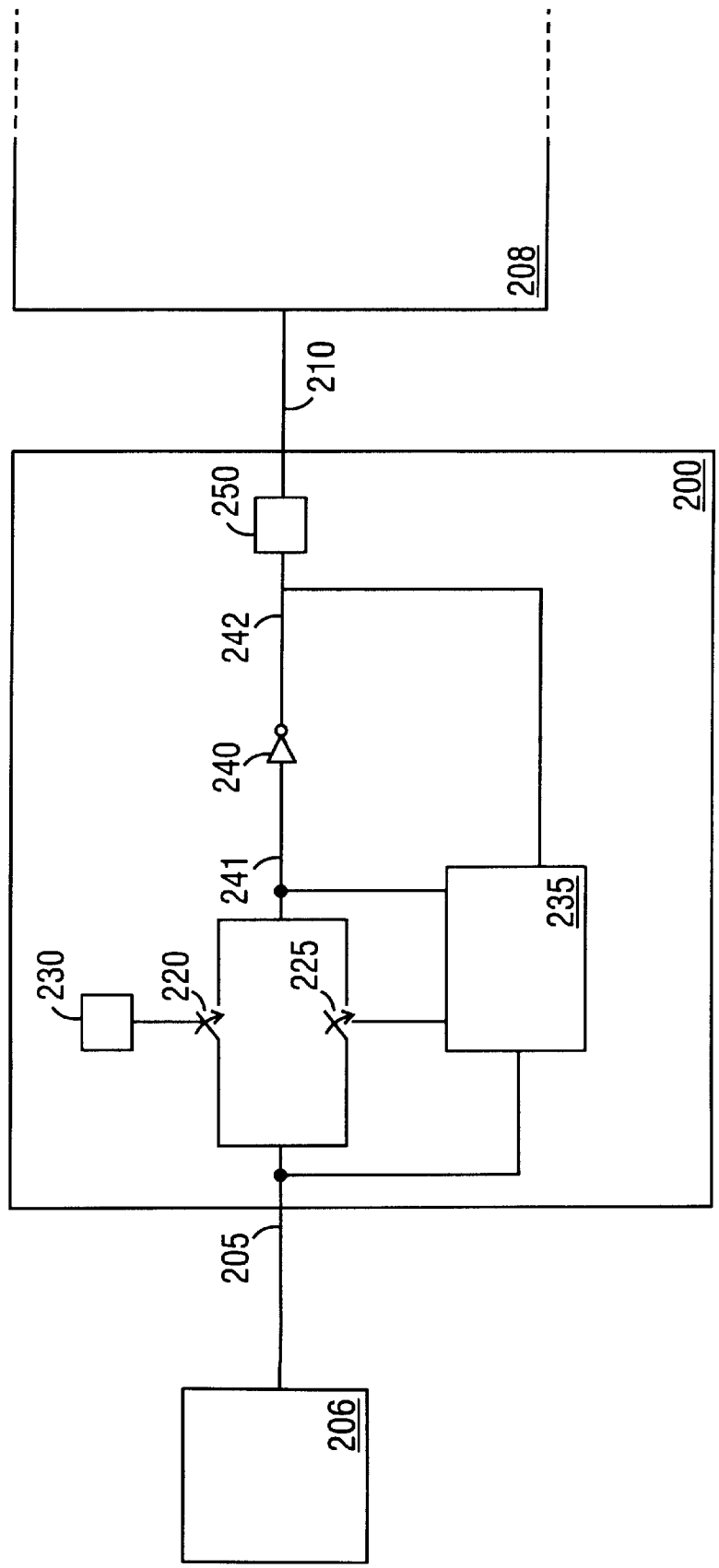
FIG. 2 is a general schematic diagram for a system with an input buffer in accordance with the invention.

FIG. 2 is a simplified block diagram for an input buffer 200 in accordance with the present invention that is designed within a microprocessor (not shown). The input buffer 200 is connected to a peripheral device 206 by the line 205 and an internal circuit 208 of the microprocessor by a line 210. As previously mentioned, signals are transmitted between the peripheral device 206 and the internal circuit 208 by the input buffer 200. The input buffer 200 functions as an interface circuit that conditions the input signal in such a manner that it can be used effectively by the internal circuit 208.

A signal emitted by the peripheral device 206 and applied to the line 205 is received by two switches 220, 225 within the input buffer 200. An enable terminal for the switch 220 is connected to a logic device 230, while an enable terminal for the switch 225 is connected to a logic circuit 235. One skilled in the art will appreciate that the logic device 230 and the logic circuit 235, respectively, control the position of the switches 220, 225. When either one of the switches is closed, an input signal may be passed from the line 205 to a line 241.

The signal on the line 241 controls the activation of the inverter 240 enabling a signal to be applied to the line 242.

After a signal is applied to the line 242, the signal may be sent to a logic device 250 to be further manipulated. The logic device 250 may then generate another signal, which is applied to the line 210 in response to the signal received on the line 242. The signal on the line 210 may then be sent to other devices within the microprocessor.

The present invention utilizes a full pass gate consisting of the switches 220, 225 with timing and feedback mechanisms to control the closure of the switch 225. This allows the level of the input signal that will pass through the pass gate to a first inverting stage to be determined. Effective balancing of this mechanism enables the input signal to propagate to the first inverting stage of the input buffer 200 without causing gate stress, while providing internal protection against gate stress.

A Specific Embodiment

Figure 3:
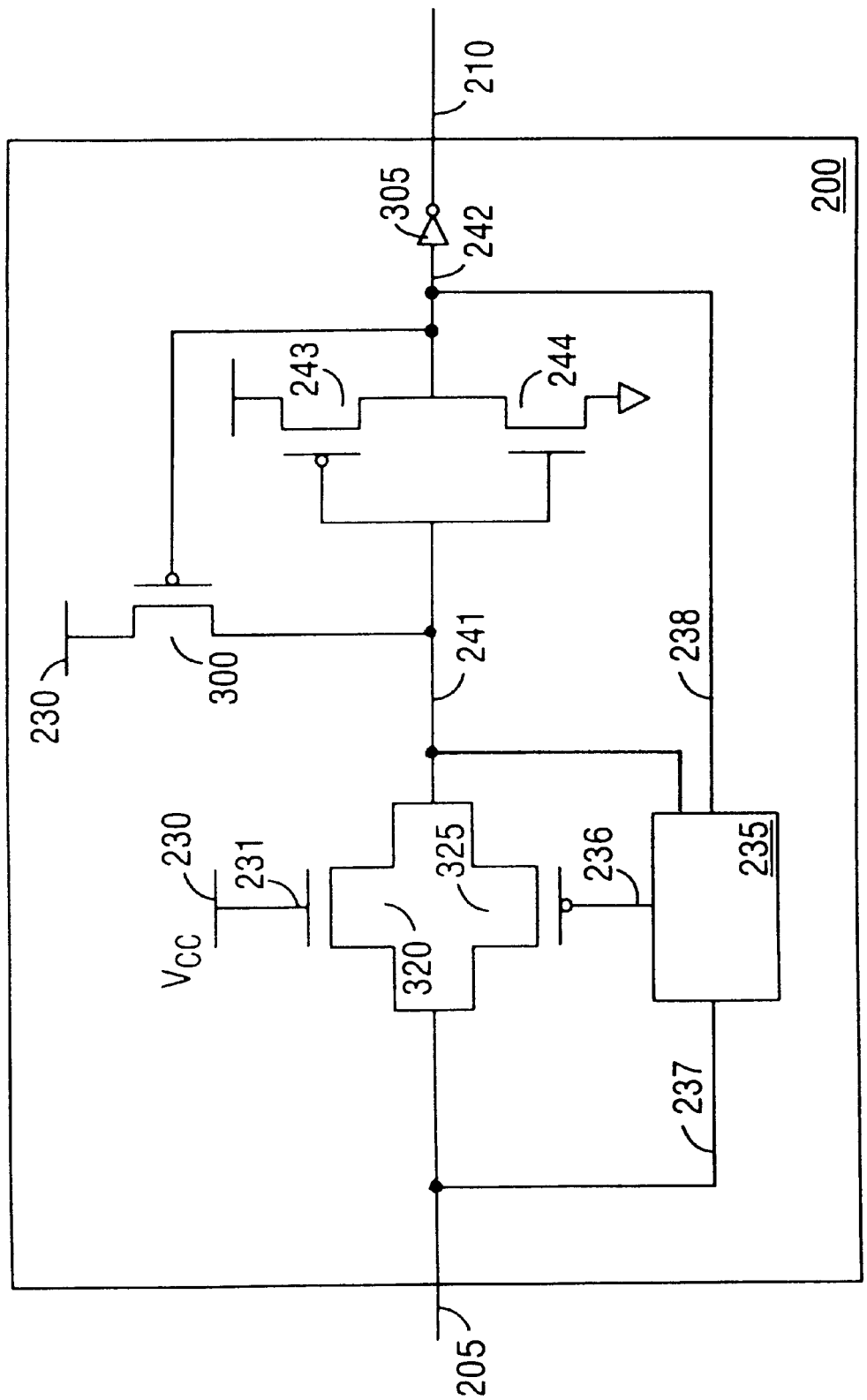
FIG. 3 is a schematic and block diagram for an input buffer according to the present invention.

FIG. 3 is a schematic and block diagram of an embodiment of the input buffer 200, which is connected to at least one peripheral device by the line 205, and is connected to the core circuit 208 by the line 210. When a peripheral device applies a signal to the line 205, the signals are sent to the two pass gate transistors 320, 325. As previously mentioned, the transistors 320, 325 function essentially as switches in that they allow the voltage on the line 205 to be applied to the line 241 when they are active. The transistor 320 has an enable terminal coupled to a core reference voltage supply such that the voltage $V_{cc}$ is applied to the gate terminal 231 of the transistor 320. This causes the NMOS pass gate transistor 320 to remain active. One skilled in the art will appreciate that though the transistors 320, 325 are MOS (metal oxide semiconductor) transistors, they may be replaced by any transistor topology (e.g., bipolar transistors and field effect transistors) that allows for complementary transistors.

The PMOS pass gate transistor 325 has source and drain terminals coupled to the lines 205, 241 and a gate terminal coupled to the logic circuit 235 by a line 236. The logic circuit 235 has a first terminal coupled to line 241, and a second terminal 238 coupled to line 242, enabling the logic circuit 235 to determine the voltage on these two lines. When the line 236 is logically low, the PMOS pass gate transistor 325 is enabled, and it is ready to pass the input signal on the line 205. If the input signal is a logically high signal, it is passed by the two transistors 320, 325. As previously mentioned, the NMOS transistor 320 will apply a signal to the line 241 with a voltage equal to the voltage $V_{cc}-V_{tn}$.

Yet, the PMOS transistor 325 will apply a voltage signal to the line 241 that has a voltage equal to the voltage of the input signal. As the voltage level of the logically high input signal increases, the transistor 325 may be used to overcome the barrier of $V_{cc}-V_{tn}$ set by the NMOS transistor 320. One skilled in the art will appreciate that if the full voltage level of the input signal is applied to the line 241, several of the transistors will suffer from gate stress.

Thus, the logic circuit 235 is designed to enable the transistor 325 for a shortened period of time during which the dependence on the voltage $V_{cc}$ is significantly diminished. Yet, the logic circuit 235 disables the transistor 325 before applying a voltage to the line 241 that would cause some of the transistors to suffer from gate stress. The logic circuit 235 does this by sensing the voltage level of the input signal on the line 242. The logic circuit 235 also has a terminal 237 that may be used to disable the transistor 325 when a predetermined voltage region is sensed on the line 242. This is used to provide stress protection for the devices inside the logic circuit 235. In addition, the line 241 may also be used to determine the timing and state of the control circuit 235.

Figure 4:
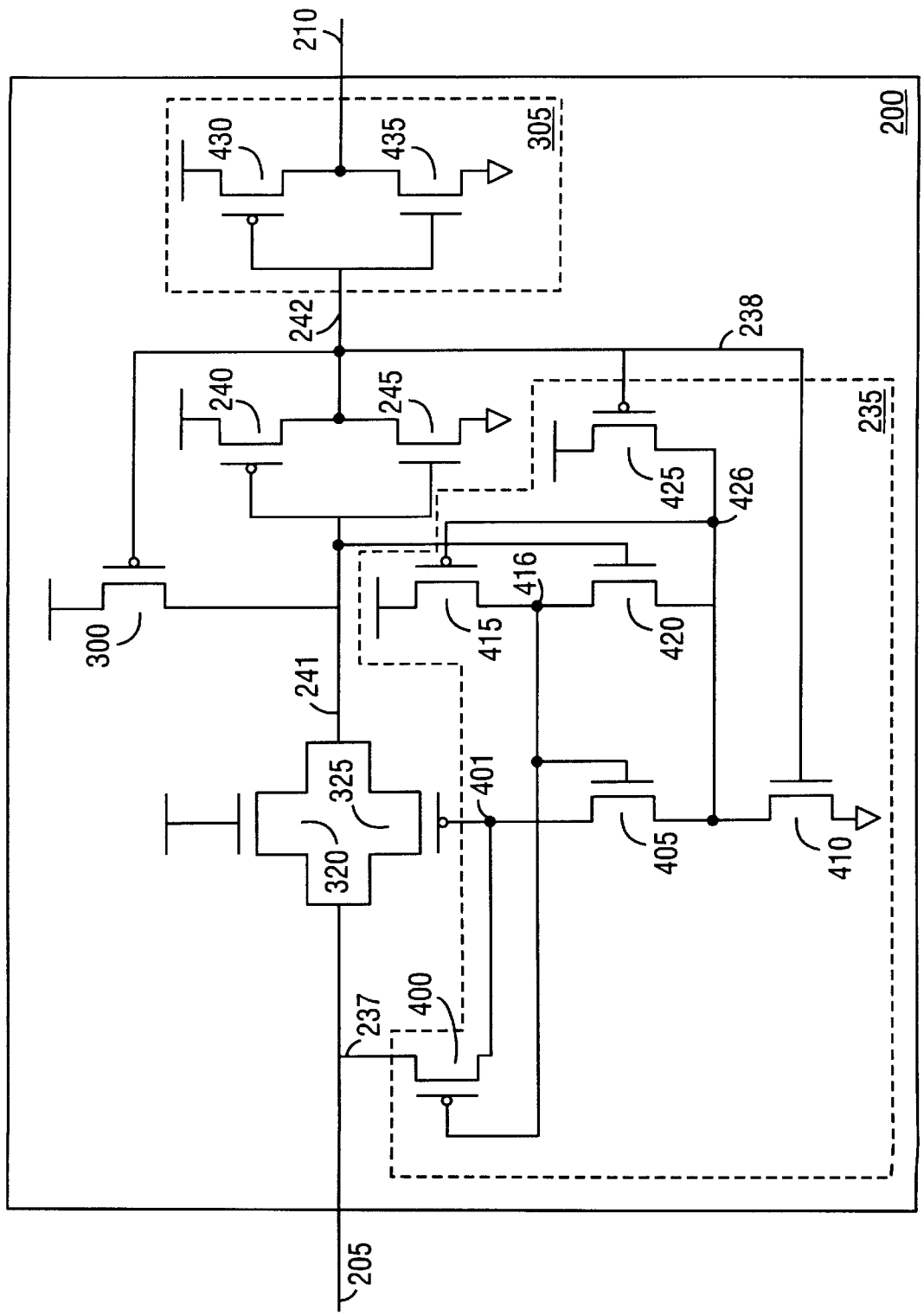
FIG. 4 is a circuit diagram for the schematic of FIG. 3.

A detailed circuit diagram for the input buffer of FIG. 3 is shown in FIG. 4. The logic circuit 235 includes the transistors 400, 405, 410, 415, 420, 425, which provide the sensing and enabling mechanisms previously described. When a logically low signal is applied to the line 241, the transistor 420 is disabled. After some delay, a logically high signal is applied to the lines 238, 242, which disables the transistor 425 and enables the transistor 410. The enabling of the transistor 410 applies a logically low signal on the node 426, which enables the transistor 415.

Because the transistor 415 is enabled, a logically high voltage is applied to the node 416, which disables the transistor 400 and enables the transistor 405. A logically low signal is applied to the node 401 which enables the transistor 325. When transistor 325 is enabled, the next time that the signal applied to the line 205 transitions to a logically high state, the signal will be passed by both the NMOS pass transistor 320 and the PMOS pass transistor 325.

The passing of a logically high signal through both transistors generates a logically high signal on the line 241. This signal enables the transistor 420, applying a logically low signal to the node 416. The logically low signal on the 416 enables the transistor 400, providing the sensing mechanism previously discussed. One skilled in the art will appreciate that, because the transistor 400 is enabled and a logically high signal is applied to the line 205, a logically high signal is applied to the node 401, which disables the transistor 325. In this manner, the PMOS pass gate transistor 325 is enabled during a shortened period of time, allowing a voltage greater than the voltage $V_{cc}-V_{tn}$ to be applied to the line 241 without potentially damaging transistors.

One skilled in the art will appreciate that holding the gate terminal of the transistor 400 at the voltage $V_{cc}$, while the input line 205 is low, disables the transistor 400 and allows a voltage of at least the voltage $V_{cc}$ to propagate through the transistors 320, 325. When the voltage level on the line 241 is high enough, the gate terminal of the transistor 400 is pulled to a low voltage level quickly, in order to pass the input signal to the node 401. This passing of the input signal allows the transistor 325 to close fast enough to hinder gate stress from occurring on the transistors 240, 245. In addition, when the first inverting stage (i.e., the transistors 240, 245) has switched, a voltage of $V_{cc}-V_{tn}$ is applied to the node 416, which also hinders gate stress from occurring on the transistors 400, 405.

This present invention provides up to 150 percent improvement in the delay, compared to the prior art input buffer. The minimal voltage $V_{cc}$ in which the buffer is still functional is less than fifteen percent of the minimum voltage $V_{cc}$ of a conventional input buffer. The present invention is also configured such that the substrate of the transistors 325, 400 are connected to the input line 205. This configuration enables the bulk effect on the threshold voltage to be reduced, while providing proper operation. The present invention uses a novel full CMOS pass gate with a control circuit to provide the gate voltage protection needed to prevent gate stress.

It will be appreciated by those of ordinary skill in the art having the benefit of this disclosure that numerous variations from the foregoing illustration will be possible without departing from the inventive concept described herein. Accordingly, it is the claims set forth below, and not merely the foregoing illustration, which are intended to define the exclusive rights of the invention.

What is claimed is:

1. An input buffer, comprising:
    a first transistor coupled between a first terminal and an input terminal of a first inverter, said first transistor having an enable terminal adapted to be coupled to a first voltage supply;
    a second transistor coupled between said first terminal and said input terminal; and
    a control circuit to enable said second transistor, said control circuit being coupled to said first terminal, an enable terminal of said second transistor, said input terminal, and an output terminal of said first inverter.

2. The buffer of claim 1 wherein said first and second transistors are complementary transistors selected from the group of transistors consisting of bipolar transistors, MOS transistors, and field effect transistors.

3. The buffer of claim 2 wherein said first inverter includes third and fourth transistors, said third and fourth transistors being complementary.

4. The buffer of claim 3, further comprising a second inverter connected in series with said first inverter, said second inverter having an input terminal coupled to said output terminal.

5. The buffer of claim 4, further comprising a fifth transistor coupled between said first voltage supply and said input terminal, said fifth transistor having an enable terminal coupled to said output terminal.

6. The buffer of claim 5 wherein said control circuit includes MOS transistors.

7. An input buffer, comprising:
    an input terminal;
    a first inverter having a first inverter input terminal and a first inverter output terminal;
    a first transistor coupled between said input terminal and said first inverter input terminal, said first transistor having an enable terminal adapted to be coupled to a first voltage supply;
    a second transistor coupled between said input terminal and said first inverter input terminal; and
    a control circuit to enable said second transistor, said control circuit being coupled to said input terminal, an enable terminal of said second transistor, said first inverter input terminal, and said first inverter output terminal.

8. The buffer of claim 7 wherein said first and second transistors are complementary transistors selected from the group of transistors consisting of bipolar transistors, MOS transistors, and field effect transistors.

9. The buffer of claim 8 wherein said first inverter includes third and fourth transistors, said third and fourth transistors being complementary.

10. The buffer of claim 9, further comprising a second inverter having a second inverter input terminal coupled to said first inverter output terminal.

11. The buffer of claim 10, further comprising a fifth transistor coupled between said first voltage supply and said first inverter input terminal, said fifth transistor having an enable terminal coupled to said second inverter input terminal.

12. The buffer of claim 11 wherein said control circuit includes MOS transistors.

13. An input buffer, comprising:
    a first PMOS transistor adapted to be coupled between a reference voltage supply and an output terminal;
    a first NMOS transistor adapted to be coupled between a ground voltage supply and said output terminal, said first NMOS transistor having a gate terminal and a source terminal, respectively, coupled to a gate terminal and a source terminal of said first PMOS transistor;
    a second NMOS transistor adapted to be coupled between an input terminal and said gate terminal of said first NMOS transistor, said second NMOS transistor having a gate terminal adapted to be coupled to said reference voltage supply;

a second PMOS transistor adapted to be coupled between said input terminal and said gate terminal of said first PMOS transistor; and a control circuit to enable said second PMOS transistor, said control circuit being coupled to said input terminal, a gate terminal of said second PMOS transistor, said gate terminal of said first PMOS transistor, said output terminal, said ground and reference voltage supplies.

14. The buffer of claim 13, further comprising an inverter having an inverter input coupled to said output terminal.

15. The buffer of claim 14, further comprising a third PMOS transistor coupled between said reference voltage supply and said gate of said first PMOS transistor, said third PMOS transistor having a gate terminal coupled to an input terminal of said inverter.

16. The buffer of claim 15 wherein said control circuit includes at least two complementary transistors selected from the group of transistors consisting of bipolar transistors, MOS transistors, and FET transistors.

17. A computer system having an interface circuit to buffer signals transmitted among devices on a main circuit board, said interface circuit comprising:

a first transistor adapted to be coupled between a first terminal and an input terminal of an inverter, said first transistor having an enable terminal adapted to be coupled to a first voltage supply;

a second transistor adapted to be coupled between said first terminal and said input terminal; and a control circuit to enable said second transistor, said control circuit being coupled to said first terminal, an enable terminal of said second transistor, said input terminal, and an output terminal of said inverter.

18. The computer system of claim 17 wherein said first and second transistors are complementary transistors selected from the group of transistors consisting of bipolar transistors, MOS transistors, and field effect transistors.

19. The computer system of claim 18 wherein said inverter includes third and fourth transistors, said third and fourth transistors being complementary.

20. The computer system of claim 19, further comprising a second inverter connected in series with said first inverter, said second inverter having a second input terminal coupled to said first output terminal.

21. The computer system of claim 20, further comprising a fifth transistor coupled between said first voltage supply and said input terminal, said fifth transistor having an enable terminal coupled to said output terminal.

22. The buffer of claim 1, wherein said control circuit includes:

a second terminal;

a third transistor coupled between said first voltage supply and said second terminal; and a fourth transistor coupled between said second terminal and a ground voltage supply;

wherein said third and fourth transistors each have a gate terminal coupled to said output terminal.

23. The buffer of claim 22, wherein said control circuit further includes:

a third terminal;

a fifth transistor coupled between said first voltage supply and said third terminal, said fifth transistor having a gate coupled to said second terminal; and a sixth transistor coupled between said second terminal and said third terminal, said sixth transistor having a gate coupled to said input terminal.

24. The buffer of claim 23, wherein said control circuit further includes:

a seventh transistor coupled between said first terminal and said enable terminal of said second transistor; and an eighth transistor coupled between said second terminal and said enable terminal of said second transistor;

wherein said seventh and eighth transistors each have a gate terminal coupled to said third terminal.

25. A method for buffering signals, comprising:

receiving a first signal at a first terminal;

creating a second signal at an input terminal by passing said first signal from said first terminal to said input terminal through parallel first and second transistors;

controlling said first transistor with a reference voltage;

controlling said second transistor with a control circuit; and creating a third signal at an output terminal by passing said second signal through an inverter.

26. The method of claim 25, wherein said controlling said second transistor includes:

enabling said second transistor to pass said first signal when said first signal goes high;

sensing a high second signal and a low third signal resulting from said high first signal; and disabling said second transistor as a result of said sensing.

27. The method of claim 26, wherein said controlling said second transistor further includes inverting said third signal to produce a fourth signal with the same logic state as said first signal.

28. The buffer of claim 1, wherein said second transistor is disabled by said control circuit when a signal at said output terminal is low.

* * * * *